United States Patent
Xu et al.

(10) Patent No.: US 10,062,566 B2
(45) Date of Patent: Aug. 28, 2018

(54) SEMICONDUCTOR DEVICE, DISPLAY SUBSTRATE, DISPLAY DEVICE, AND METHOD FOR MANUFACTURING POLYSILICON FILM

(71) Applicant: BOE TECHNOLOGY GROUP CO., LTD., Beijing (CN)

(72) Inventors: Wenqing Xu, Beijing (CN); Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 14/894,908

(22) PCT Filed: Jul. 16, 2015

(86) PCT No.: PCT/CN2015/084215
§ 371 (c)(1),
(2) Date: Nov. 30, 2015

(87) PCT Pub. No.: WO2016/155149
PCT Pub. Date: Oct. 6, 2016

(65) Prior Publication Data
US 2017/0117148 A1    Apr. 27, 2017

(30) Foreign Application Priority Data
Mar. 27, 2015  (CN) .......................... 2015 1 0142635

(51) Int. Cl.
*H01L 27/14*    (2006.01)
*H01L 29/04*    (2006.01)
(Continued)

(52) U.S. Cl.
CPC .. *H01L 21/02513* (2013.01); *H01L 21/02488* (2013.01); *H01L 21/02502* (2013.01);
(Continued)

(58) Field of Classification Search
CPC ......... H01L 21/02513; H01L 21/02488; H01L 21/02502; H01L 21/02532;
(Continued)

(56) References Cited

U.S. PATENT DOCUMENTS

2006/0270236 A1* 11/2006 Kusumoto .......... H01L 27/1266
438/692
2007/0263131 A1   11/2007 Uemoto
(Continued)

FOREIGN PATENT DOCUMENTS

CN          101071239 A       11/2007
CN          101140911 A       3/2008
(Continued)

OTHER PUBLICATIONS

English Machine Translation of Japan Patent Publication No. JP2008-004812.*
(Continued)

*Primary Examiner* — Dzung Tran
(74) *Attorney, Agent, or Firm* — Harness, Dickey & Pierce, P.L.C.

(57) ABSTRACT

A semiconductor device, comprising a base substrate, a buffer layer and a polysilicon layer film, wherein the base substrate, the buffer layer and the polysilicon layer film being laminated sequentially, and wherein regularly arranged first grooves being provided on a surface of the buffer layer contacting the polysilicon film; the polysilicon film being formed, by applying crystallization treatment, through an optical annealing process, to an amorphous silicon film on the buffer layer having regularly arranged first grooves.

9 Claims, 3 Drawing Sheets

(51) Int. Cl.
*H01L 27/15* (2006.01)
*H01L 29/18* (2006.01)
*H01L 21/02* (2006.01)
*H01L 29/16* (2006.01)
*H01L 29/786* (2006.01)
*H01L 27/12* (2006.01)

(52) U.S. Cl.
CPC .. *H01L 21/02532* (2013.01); *H01L 21/02592* (2013.01); *H01L 21/02675* (2013.01); *H01L 27/1222* (2013.01); *H01L 27/1274* (2013.01); *H01L 29/04* (2013.01); *H01L 29/16* (2013.01); *H01L 29/78672* (2013.01)

(58) Field of Classification Search
CPC ......... H01L 21/02592; H01L 21/02675; H01L 27/1222; H01L 27/1274; H01L 29/04; H01L 29/16; H01L 29/78672
USPC .................................. 257/59, 72, 88, 98, 79
See application file for complete search history.

(56) References Cited

U.S. PATENT DOCUMENTS

| | | | | |
|---|---|---|---|---|
| 2008/0210945 | A1* | 9/2008 | Miyairi | B23K 26/0626 257/66 |
| 2009/0218574 | A1* | 9/2009 | Noda | H01L 27/1214 257/72 |
| 2009/0225251 | A1* | 9/2009 | Kaitoh | G02F 1/1303 349/46 |
| 2011/0318881 | A1* | 12/2011 | Chida | H01L 21/561 438/118 |
| 2013/0256668 | A1* | 10/2013 | Oh | H01L 29/66757 257/59 |

FOREIGN PATENT DOCUMENTS

| | | |
|---|---|---|
| CN | 102655089 A | 9/2012 |
| CN | 103219228 A | 7/2013 |
| CN | 103700695 A | 4/2014 |
| JP | H04132212 A | 5/1992 |
| JP | 2008004812 A | 1/2008 |

OTHER PUBLICATIONS

English Machine Translation of Japan Patent Publication No. JP2005-079209.*

Written Opinion of the International Searching Authority from corresponding PCT Application No. PCT/CN2015/084215, Sep. 30, 2015 (3 pages).

Office Action from corresponding Chinese Application No. 201510142635.X, Mar. 13, 2017 (8 pages).

* cited by examiner

SEMICONDUCTOR DEVICE, DISPLAY SUBSTRATE, DISPLAY DEVICE, AND METHOD FOR MANUFACTURING POLYSILICON FILM

TECHNICAL FIELD

The present invention relates to the technical field of semiconductor, more particularly, to a semiconductor device, a display substrate, a display device, and a method for manufacturing a polysilicon film.

BACKGROUND

There are many unavoidable defects of prior amorphous silicon, e.g., low mobility, low stability, etc. Compared with the amorphous silicon, low temperature polysilicon has higher mobility and stability. Therefore, the low temperature polysilicon technology develops rapidly. However, the unevenness of the grain size and the irregular arrangement of the grains of the polysilicon will make the threshold voltage uneven, therefore influence the display quality of the display panel using the polysilicon film.

SUMMARY

An embodiment of the present invention provides a method for manufacturing a polysilicon film, to solve the problem that, for the polysilicon film manufactured by the prior-art method for manufacturing the polysilicon film, the grain sizes of the polysilicon are uneven and the grain arrangement thereof is irregular.

An embodiment of the present invention provides a method for manufacturing a polysilicon film, comprising: forming a buffer layer on a base substrate; forming regularly arranged first grooves on the surface of the buffer layer; forming an amorphous silicon film on the buffer having the first grooves; and applying crystallization treatment, by optical annealing process, to the amorphous silicon film to form a polysilicon film.

Optionally, the optical annealing process comprises an excimer laser annealing process.

Optionally, the buffer layer comprises at least one first buffer sub-layer and at least one second buffer sub-layer, the first buffer sub-layer and the second buffer sub-layer being laminated and arranged alternately.

Optionally, the material of the first buffer sub-layer is silicon dioxide, and the material of the second buffer sub-layer is silicon nitride.

Optionally, the distance between the first grooves ranges from 300 nm to 400 nm.

Optionally, the first grooves are circular or square or rectangle.

Optionally, the method further comprises, before applying the crystallization treatment, by optical annealing process, to the amorphous silicon film s, applying a dehydrogenation treatment to the amorphous silicon film.

Optionally, the material of the buffer layer is silicon oxide.

Optionally, the thickness of the buffer layer ranges from 100 nm to 600 nm.

An embodiment of the present invention also provides a semiconductor device, which comprises a base substrate, a buffer layer and a polysilicon film, wherein the base substrate, the buffer layer and the polysilicon layer film are laminated sequentially, wherein regularly arranged first grooves are provided on a surface of the buffer layer contacting the polysilicon film, the polysilicon film is formed, by applying crystallization treatment to the amorphous silicon film on the buffer layer provided with regularly arranged first grooves, through an optical annealing process.

An embodiment of the present invention also provides a display substrate, which comprises a base substrate, a buffer layer and a polysilicon film, wherein the base substrate, the buffer layer and the polysilicon layer film are laminated sequentially; wherein regularly arranged first grooves are provided on a surface of the buffer layer contacting the polysilicon film; the polysilicon film is formed, by applying crystallization treatment, through an optical annealing process, to the amorphous silicon film on the buffer layer having regularly arranged first grooves.

Optionally, the buffer layer comprises at least one first buffer sub-layer and at least one second buffer sub-layer, the first buffer sub-layer and the second buffer sub-layer are laminated.

Optionally, the first buffer sub-layer and the second buffer sub-layer are arranged alternately, and the material of the first buffer sub-layer is silicon dioxide, and the material of the second buffer sub-layer is silicon nitride.

Optionally, the distance between the first grooves ranges from 300 nm to 400 nm.

Optionally, the thickness of the buffer layer ranges from 100 nm to 600 nm.

An embodiment of the present invention also provides a display device, comprising any one of the above display substrates.

The present invention has the following advantageous effects:

The method for manufacturing polysilicon film according to the present invention comprises: forming a buffer layer on a base substrate; forming regularly arranged first grooves on a surface of the buffer layer; forming an amorphous silicon film on the buffer layer having the first grooves; and applying a crystallization treatment, by optical annealing process, to the amorphous silicon film to form a polysilicon film. According to the present invention, the amorphous silicon film is formed after forming the regularly arranged first grooves on the buffer layer, and then crystallization treatment is applied to the amorphous silicon film by using the optical annealing process. Since the focus of the laser beam in the optical annealing process cannot reach the depth of the amorphous silicon material in the first grooves, the energy applied thereon is lower than the energy applied on the amorphous silicon material at other positions. Therefore, the amorphous silicon material in the first grooves forms un-melted crystallization seeds during the annealing process. Since the first grooves are arranged regularly, the crystallization seeds are also arranged regularly, and thus a polysilicon film with even grain size and regularly arranged grains can be formed. The semiconductor device, the display substrate and the display device of the present invention comprise the polysilicon film manufactured by the above method for manufacturing the polysilicon film of the present invention, and thus have improved performances.

DETAILED DESCRIPTION OF ILLUSTRATIVE EMBODIMENTS

In order to make those skilled in the art to better understand the technical solutions of the present invention, the method for manufacturing the polysilicon film, the semiconductor device, the display substrate and the display device of the present invention will be described in details with reference to the drawings.

First Embodiment

Figure 1:
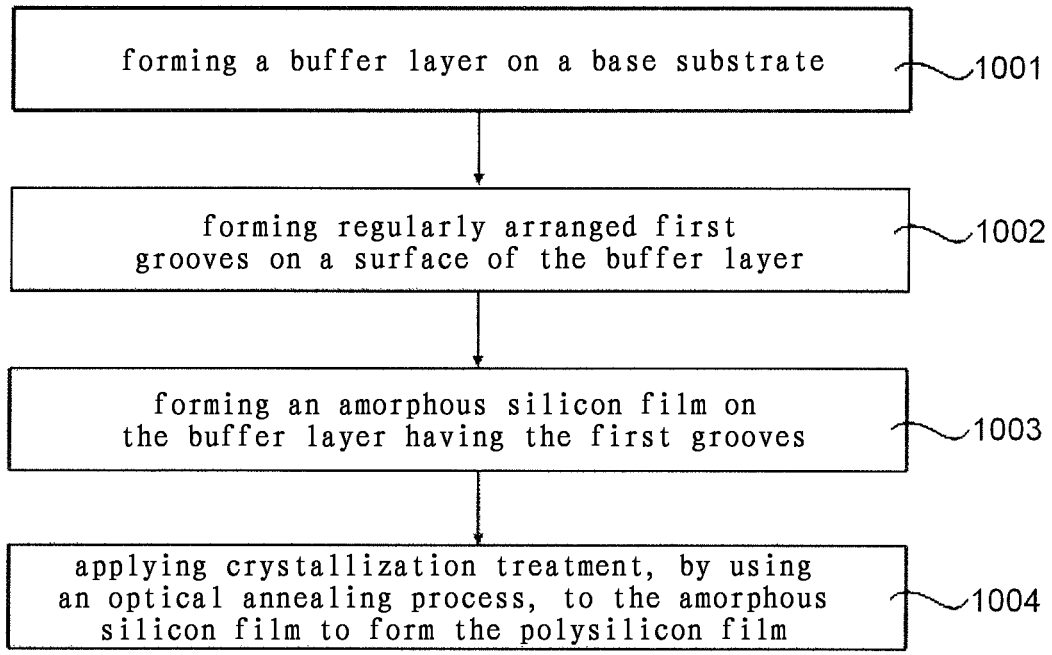
FIG. 1 is a flow chart of a method for manufacturing a polysilicon film provided by a first embodiment of the present invention.

FIG. 1 is a flow chart of a method for manufacturing a polysilicon film provided by the first embodiment of the present invention. As shown in FIG. 1, the method for manufacturing the polysilicon film comprises following steps 1001 to 1004.

Step 1001, forming a buffer layer on a base substrate.

Figure 2:
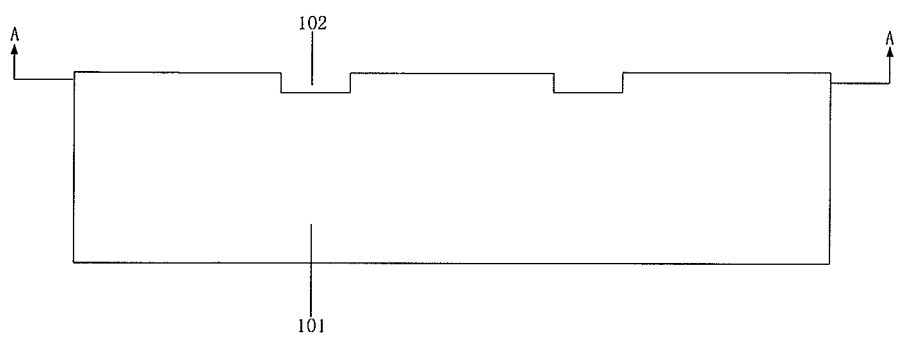
FIG. 2 is a cross-sectional view of a buffer layer formed according to the method of the first embodiment of the present invention.
Figure 3:
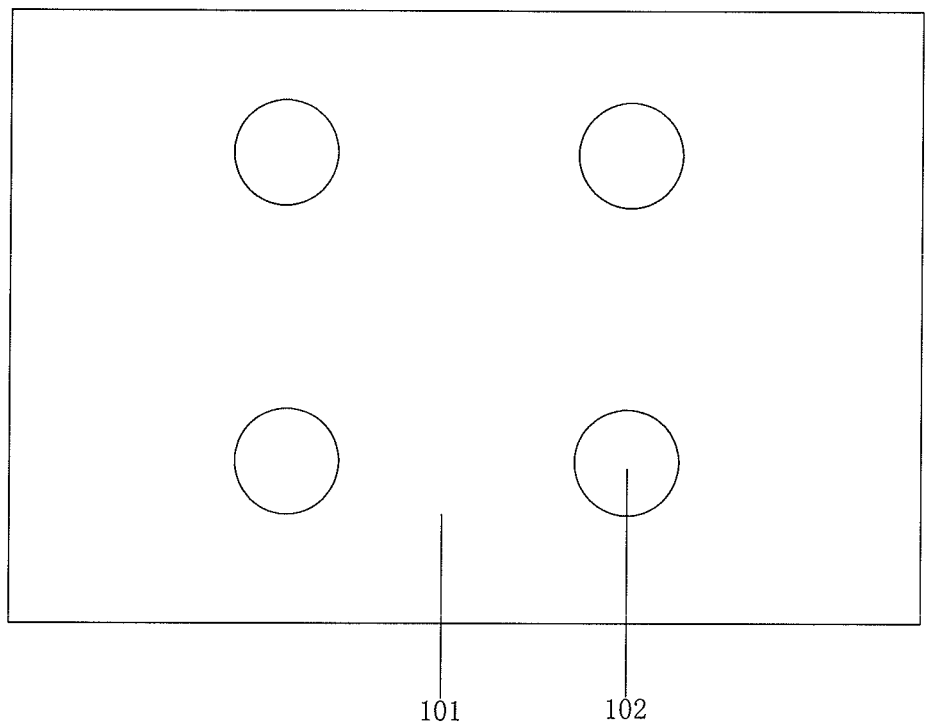
FIG. 3 is an A-A profile of the buffer layer shown in FIG. 2.

FIG. 2 is a cross-sectional view of the buffer layer formed according to the method of the first embodiment of the present invention. FIG. 3 is an A-A profile of the buffer layer shown in FIG. 2. As shown in FIGS. 2 and 3, a buffer layer 101 is formed on the base substrate (not shown). The material of the buffer layer 101 may be silicon dioxide. Optionally, the buffer layer 101 comprises a first buffer sub-layer and a second buffer sub-layer (not shown in the Figure), wherein the first buffer sub-layer and a second buffer sub-layer is laminated. In practical application, the buffer layer 101 may comprise a plurality of first buffer sub-layers and a plurality of second buffer sub-layers, and the first buffer sub-layer and the second buffer sub-layer are laminated and arranged alternately. Optionally, the material of the first buffer sub-layer is silicon dioxide, and the material of the second buffer sub-layer is silicon nitride. Preferably, the range of the thickness of the buffer layer is from 100 nm to 600 nm. The buffer layer is for smoothing the base substrate, and for preventing impurities in the base substrate from entering into the polysilicon film during a formation of the polysilicon film.

Step 1002, forming regularly arranged first grooves on a surface of the buffer layer.

Referring to FIGS. 2 and 3, first grooves 102 are arranged regularly on a surface of the buffer layer 101 (i.e., the surface opposite to the surface contacting the base substrate). In practical application, a photoresist is coated on the buffer layer, and the photoresist is exposed and developed by using a mask to form a photoresist reserved region and a photoresist unreserved region; the photoresist unreserved region corresponds to a pattern region forming the first grooves, and the photoresist reserved region corresponds to other regions except the pattern region. The buffer layer is etched to form the first grooves. Optionally, the range of the distance between the first grooves 102 is from 300 nm to 400 nm, and the first grooves 102 may be circular or square or rectangle.

Step 1003, forming an amorphous film on the buffer layer having the first grooves.

Figure 4:
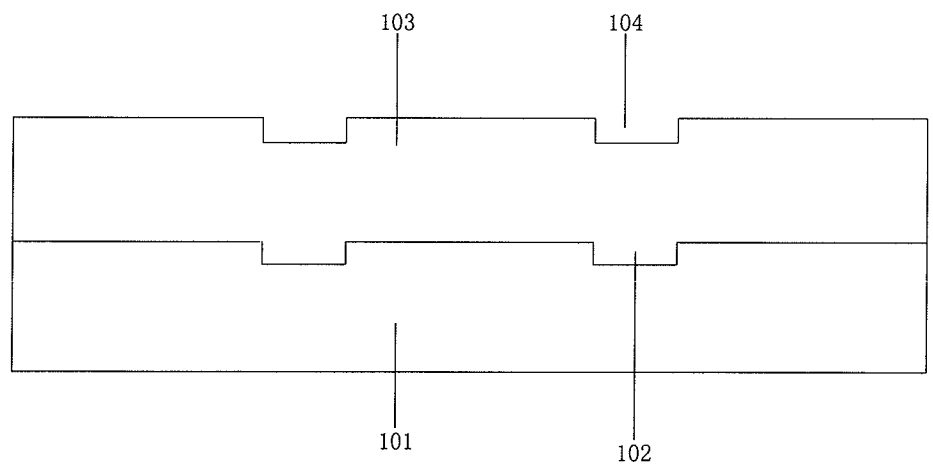
FIG. 4 is a cross-sectional view of the amorphous silicon film formed according to the method of the first embodiment of the present invention.

FIG. 4 is a cross-sectional view of an amorphous silicon film formed according to the method of the first embodiment of the present invention. As shown in FIG. 4, an amorphous silicon film 103 is formed on the buffer layer 101. Since the surface of the buffer layer 101 is provided with first grooves 102, the surface of the amorphous silicon film 103 is also provided with second grooves 104 which correspond to the first grooves 102. Since the first grooves 102 are arranged regularly, the second grooves 104 are also arranged regularly. Preferably, the amorphous silicon film is subjected to a dehydrogenation treatment.

Step 1004, applying crystallization treatment, by an optical annealing process, to the amorphous silicon film to form a polysilicon film.

Figure 5:
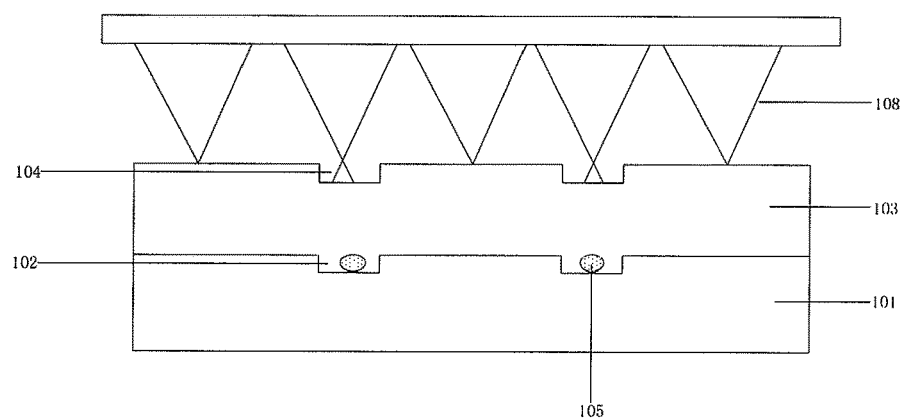
FIG. 5 is a schematic view of applying annealing treatment to the amorphous silicon film shown in FIG. 4.
Figure 6:
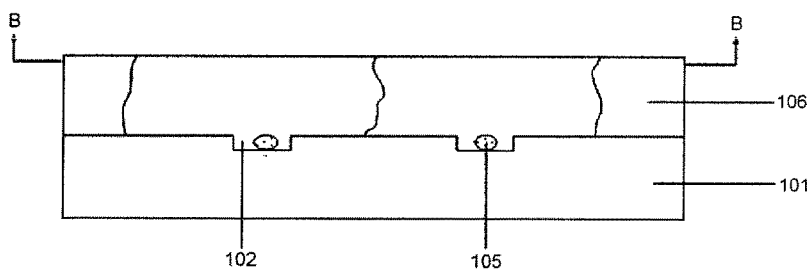
FIG. 6 is a cross-sectional view of the polysilicon film formed by the method according to the first embodiment of the present invention.

FIG. 5 is a schematic view of applying annealing treatment to the amorphous silicon film shown in FIG. 4. As shown in FIG. 5, crystallization treatment is applied to the amorphous silicon film 103 by using an excimer laser annealing process. Since there are second grooves 104 arranged regularly on the amorphous silicon film 103, when the excimer laser annealing treatment is performed, in the condition of making laser 108 to focus on the upper surface of the amorphous silicon film 103, the focus of laser 108 cannot reach the depth where the amorphous silicon material corresponding to the second grooves 104 is located. The energy received by the amorphous silicon material corresponding to the second grooves 104 from the laser is lower than the energy received by the amorphous silicon material corresponding to the region other than the second grooves 104 from the laser. When the amorphous silicon material corresponding to the region other than the second grooves 104 is melted, some of the amorphous silicon material corresponding to the second grooves 104 still cannot be melted, therefore forms crystallization seeds 105 (for example, crystallization seeds 105 will be formed in the amorphous silicon material in the first grooves corresponding to the second grooves 104, as shown in FIG. 6). The regularly arranged second grooves 104 will form regularly arranged crystallization seeds 105, therefore forms a polysilicon film with grains of even size and arranged regularly.

Figure 7:
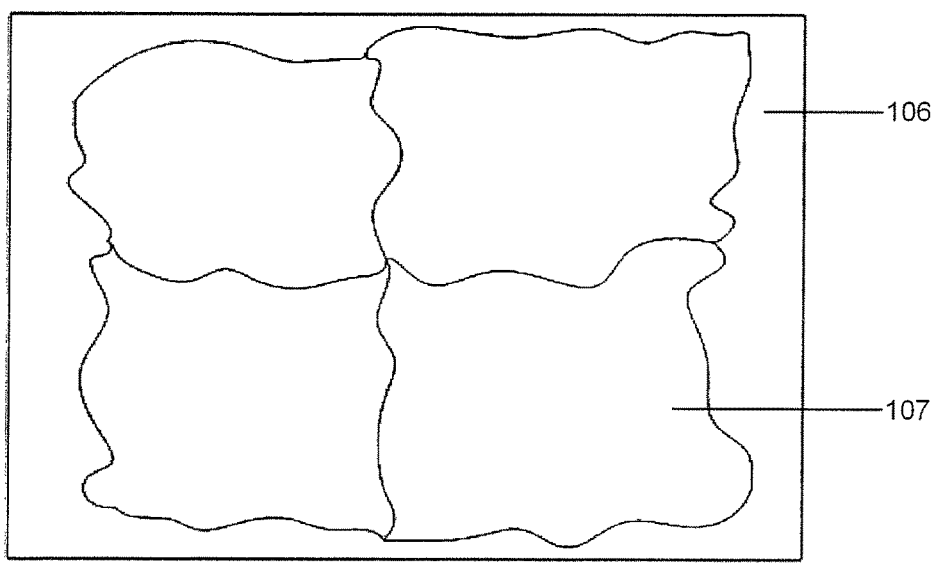
FIG. 7 is a B-B profile of the polysilicon film shown in FIG. 6.

FIG. 6 is a cross-sectional view of the polysilicon film formed according to the method of the first embodiment of the present invention, and FIG. 7 is a B-B profile of the polysilicon film shown in FIG. 6. As shown in FIGS. 6 and 7, crystallization seeds 105 will be formed in the first grooves 102, and grains 107 are formed with the crystallization seeds 105 as the cores. Since the first grooves 102 are arranged regularly, the formed grains 107 are of even size and arranged regularly.

The method for manufacturing the polysilicon film according to this embodiment comprises: forming a buffer layer on a base substrate; forming regularly arranged first grooves on a surface of the buffer layer; forming an amorphous silicon film on the buffer layer having the first grooves; and applying crystallization treatment, by using an optical annealing process, to the amorphous silicon film to form a polysilicon film. According to this embodiment, the amorphous silicon film is formed after the regularly arranged first grooves are formed on the buffer layer, and then crystallization treatment is applied to the amorphous silicon film by using the optical annealing process. Since the focus of the laser beam during the optical annealing process cannot reach the depth of the amorphous silicon material in the first grooves, the energy applied thereon is lower than the energy applied on the amorphous silicon material at other positions. Therefore, the amorphous silicon material in the first grooves forms un-melted crystallization seeds during the annealing process. Since these first grooves are arranged regularly, the crystallization seeds are also arranged regularly, therefore forming a polysilicon film with grains of even size and arranged regularly.

Second Embodiment

This embodiment provides a semiconductor device, which comprises a base substrate, a buffer layer and a polysilicon film, wherein the base substrate, the buffer layer and the polysilicon film are laminated sequentially; and wherein first grooves which are arranged regularly are provided on a surface of the buffer layer contacting the polysilicon film; and the polysilicon film is formed, by applying crystallization treatment to the amorphous film formed on the buffer layer on which the first grooves are arranged regularly, through optical annealing processes. Other components of the semiconductor device may be formed by the prior art manufacturing methods, which are omitted here.

Thus it can be seen that the semiconductor device provided by this embodiment comprises the polysilicon film manufactured by the method for manufacturing the polysilicon film of the present invention. Therefore, the grains of the polysilicon film in the semiconductor device are of even size and arranged regularly, therefore the performance of the semiconductor device is improved.

Third Embodiment

This embodiment provides a display substrate, which comprises a base substrate, a buffer layer and a polysilicon film, wherein the base substrate, the buffer layer and the polysilicon film are laminated sequentially; and wherein a surface of the buffer layer contacting the polysilicon film is provided with first grooves which are arranged regularly; and the polysilicon film is formed, by applying crystallization treatment to the amorphous silicon film formed on the buffer layer with the regularly arranged first grooves, through an optical annealing process.

Specifically, the amorphous film is formed on the buffer layer. Since the surface of the buffer layer is provided with the first grooves, the surface of the amorphous silicon film will also form second grooves corresponding to the first grooves. Since the first grooves are arranged regularly, the second grooves are also arranged regularly. Then, crystallization treatment is applied to the amorphous silicon film by using an excimer laser annealing process. Since the amorphous film is provided with regularly arranged second grooves, when the laser used in the annealing process is focused on the upper surface of the amorphous silicon film, the focus of the laser cannot reach the depth of the amorphous silicon material corresponding to the second grooves. The energy received by the amorphous silicon material corresponding to the second grooves from the laser is lower than the energy received by the amorphous silicon material corresponding to the region other than the second grooves. Therefore, when the amorphous silicon material of the region other than the second grooves is melted, some of the amorphous silicon material corresponding to the second grooves still cannot be melted, therefore forms the crystallization seeds. The regularly arranged second grooves may form regularly arranged crystallization seeds, therefore forms a polysilicon film with grains of even size and arranged regularly.

In this embodiment, the buffer layer may comprise a first buffer sub-layer and a second buffer sub-layer, wherein the first buffer sub-layer and the second buffer sub-layer are laminated. In the practical application, the buffer layer may comprise a plurality of first buffer sub-layers and a plurality of second buffer sub-layers, and the first buffer sub-layers and the second buffer sub-layers are arranged alternately. Optionally, the material of the first buffer sub-layer is silicon oxide, and the material of the second buffer sub-layer is silicon nitride. Preferably, the range of the thickness of the buffer layer is from 100 nm to 600 nm. The buffer layer is used to smooth the base substrate, and prevents impurities in the base substrate from entering into the polysilicon film during a formation of the polysilicon film.

Optionally, the range of the distance between the first grooves is 300 nm to 400 nm, and the first grooves are in shape of circular or square or rectangle; the range of the thickness of the buffer layer is from 100 nm to 600 nm.

The display substrate provided by this embodiment comprises the polysilicon film manufactured by the method for manufacturing the polysilicon film of the present invention. Therefore, the grains of the polysilicon film in this display substrate are of even size and arranged regularly; and the performance of the display substrate is improved.

Fourth Embodiment

This embodiment further provides a display device comprising the display substrate of the third embodiment, the specific description of which is already described in the above third embodiment and will not repeated here.

The display device provided by the embodiment comprises the polysilicon film manufactured by the method for manufacturing the polysilicon film of the present invention, and therefore the grains of the polysilicon film in the display device are of even size and arranged regularly, thus the display quality of the display device is improved.

It may be understood that the above implementations are merely exemplary implementations used to explain the principles of the present invention, and not to limit the scope of present invention. To those skilled in the art, various variations and modifications may be made without departing from the spirit and essences of the present invention. It is understand that such variations and modifications are also encompassed within the protection scope of the present invention.

What is claimed is:
1. A method for manufacturing a polysilicon film, the method comprising:
   forming a buffer layer having a first surface and a second surface opposing the first surface on a base substrate;
   forming regularly arranged first grooves on the first surface of the buffer layer, wherein the first grooves do not extend through the second surface of the buffer layer;
   forming an amorphous silicon film on the first surface of the buffer layer having the first grooves, the amorphous silicon film including a surface having second grooves corresponding to the first grooves; and
   applying a crystallization treatment, by a laser annealing process, to the amorphous silicon film to form a polysilicon film such that when a laser beam is focused on the surface of the amorphous silicon film, the focus of the laser beam cannot reach a depth of the second grooves.

2. The method for manufacturing a polysilicon film according to claim 1, wherein the laser annealing process comprises an excimer laser annealing process.

3. The method for manufacturing a polysilicon film according to claim 1, wherein the buffer layer comprises at least one first buffer sub-layer and at least one second buffer sub-layer, the first buffer sub-layer and the second buffer sub-layer being laminated and arranged alternately.

4. The method for manufacturing a polysilicon film according to claim 3, wherein the first buffer sub-layer includes silicon dioxide, and the second buffer sub-layer includes silicon nitride.

5. The method for manufacturing a polysilicon film according to claim 1, wherein the distance between the first grooves ranges from 300 nm to 400 nm.

6. The method for manufacturing a polysilicon film according to claim 1, wherein the first grooves are circular, square or rectangle.

7. The method for manufacturing polysilicon film according to claim 1, further comprising, before applying the crystallization treatment, by the laser annealing process, to the amorphous silicon film, applying a dehydrogenation treatment to the amorphous silicon film.

8. The method for manufacturing a polysilicon film according to claim 1, wherein the buffer layer includes silicon dioxide.

9. The method for manufacturing a polysilicon film according to claim 1, wherein the thickness of the buffer layer ranges from 100 nm to 600 nm.

* * * * *